United States Patent [19]

Nadeau-Dostie et al.

[11] Patent Number: 4,969,148
[45] Date of Patent: Nov. 6, 1990

[54] SERIAL TESTING TECHNIQUE FOR EMBEDDED MEMORIES

[75] Inventors: Benoit Nadeau-Dostie, Aylmer; Allan Silburt, Ottawa; Vinod K. Agarwal, Brossard, all of Canada

[73] Assignee: Northern Telecom Limited, Montreal, Canada

[21] Appl. No.: 319,979

[22] Filed: Mar. 7, 1989

[51] Int. Cl.$^5$ .............................................. G06F 11/00
[52] U.S. Cl. .................................. 371/21.1; 371/22.5; 371/27
[58] Field of Search .................... 371/21.1, 21.2, 21.3, 371/22.3, 22.2, 22.1, 22.5, 22.6, 25.1, 27; 365/201

[56] References Cited

U.S. PATENT DOCUMENTS

| | | | |
|---|---|---|---|
| 4,481,627 | 11/1984 | Beauchesne | 371/21.1 |
| 4,602,210 | 7/1986 | Fasang | 371/22.3 |
| 4,670,877 | 6/1987 | Nishible | 371/22.3 |
| 4,733,392 | 3/1988 | Yamaguchi | 371/21.1 |

OTHER PUBLICATIONS

Y. You, et al., "A Self-Testing Dynamic RAM Chip", Proc. MIT Conf. on Advanced Research in VLSI, 1/1984, pp. 159-168.
B. Nadeau-Dostie, et al., "BIST for Embedded Register Files", BIST Workshop, Kiawah Island, Charleston, SC., U.S.A., 3/23/1988.
Z. Sun et al., "Self-Testing of Embedded RAM's ", Proc. IEEE Int. Test Conf. 10/1984, pp. 148-156.

F. P. M. Beenker et al., "IEEE Design & Test", 12/1986, pp. 26-32.

Primary Examiner—Jerry Smith
Assistant Examiner—Robert W. Beausoliel
Attorney, Agent, or Firm—Philip W. Jones

[57] ABSTRACT

A testing circuit interfaces serially with the data path of an embedded memory circuit formed from at least one memory unit having separated data input and output lines and tandem addressing. Part of the testing circuit is a series of two-input multiplexer units which are adapted to be embedded on the same chip as the memory circuit. The outputs of the multiplexer units connect to a respective one of the data input lines of the memory circuit. Excepting the first bit position, a first input of each multiplexer unit is adapted to connect to the data output line of the adjacent bit position in the memory circuit. The second inputs of the multiplexer units are adapted to connect to the data bus of the chip. A further part of the testing circuit is a finite state machine which is adapted to connect to the first input of the multiplexer unit at the first bit position and to the data output line at the least bit position. During testing, the finite state machine actuates the multiplexer units to connect the first bits, and for each address outputs a series of test bits, shifts those bits through the addressed word by a series of read and write operations, and examines those bit after their passage through the addressed word for defects in the memory circuit at that address. The finite state machine may or may not be embedded on the same chip as the memory circuit.

9 Claims, 7 Drawing Sheets

| TIME | OPER-ATION | SERIAL IN | WORD CONTENTS | | | | SERIAL OUT |
|---|---|---|---|---|---|---|---|
| 0 |  | X | 0 | 0 | 0 | 0 | X |
| 1 | RO | X | 0 | 0 | 0 | 0 | 0 |
| 2 | WI | 1 | 1 | 0 | 0 | 0 | 0 |
| 3 | RO | 1 | 1 | 0 | 0 | 0 | 0 |
| 4 | WI | 1 | 1 | 1 | 0 | 0 | 0 |
| 5 | RO | 1 | 1 | 1 | 0 | 0 | 0 |
| 6 | WI | 1 | 1 | 1 | 1 | 0 | 0 |
| 7 | RO | 1 | 1 | 1 | 1 | 0 | 0 |
| 8 | WI | 1 | 1 | 1 | 1 | 1 | 0 |

FIG. 4

SERIAL TESTING TECHNIQUE FOR EMBEDDED MEMORIES

The invention relates to a testing circuit for determining the integrity of embedded memory circuits, and more particularly, to a testing circuit which interfaces serially with the data path of such memory circuits.

It is common for telecommunication integrated circuits to have a variety of multi-port memory circuits on one chip, often with only a few addresses but very wide data paths. In such cases, external access to the memory circuits for testing purposes is made complex by the difficulty in connecting each of the data lines of the memory circuits to pins. Additional limitations to external testing may be imposed by test hardware and design automation tools, which often do not have the ability to support algorithmic stimuli in simulation or high level test generation. On the other hand, expanding an algorithmic memory test into individual vectors which must be stored and then loaded can easily exceed the maximum pattern depth of test hardware, particularly if the patterns must be multiplexed. These issues are making testing techniques such as Built-In Self-Testing (BIST) more attractive from a chip design and manufacturing perspective.

A number of techniques have been proposed for testing memory circuits that involve reading and evaluating all of the bits of a memory word in parallel. Some of these techniques require modifications to proven RAM circuitry, something that may not be possible or practical in many integrated circuit design environments. There is a significant problem in applying such schemes when multiple embedded RAMs of varying widths and port configurations are used on one chip. If each memory circuit were allotted its own dedicated testing circuit, the chip area devoted to testing would become unacceptably large. Therefore, it is advantageous to share testing circuitry among several RAM blocks. It is also desirable to make alternate use of as much of the test circuitry as possible during the normal operation of the chip; such sharing of circuitry may be quite difficult or inefficient to achieve with the existing testing schemes.

At the Conference on Advanced Research in VLSI, held at M.I.T. in January, 1984, Younggap You and John P. Hayes presented a paper entitled 'A Self-Testing Dynamic RAM Chip'. The paper relates to a BIST system that includes the use of a circular shift register for testing a storage subarray. A specific design is included for a shift operation using modified sense amplifiers. A read operation followed by a write operation is used to transfer a test bit between adjacent memory cells in the storage subarray. To make use of the testing circuitry described in this paper, most proven RAM cell designs would require modification. It is one object of the test circuit of the invention to overcome this disadvantage. The test circuit of the invention requires that only a small amount of additional circuitry be added to a chip layout. Only a small number of lines is required to connect the test controller so that it may be shared by several memory circuits. A further advantage of the test circuit of the invention is its compatibility with high fault coverage test algorithms.

The invention is a memory test circuit capable of testing at least one random access memory circuit adapted to be embedded on a chip. Two forms of the memory test circuit will be described.

In the first form of the invention, the at least one memory circuit may be described as having an aggregate of 'N' data input lines and 'N' data output lines. During testing, each memory circuit of the at least one memory circuit shares the same 'M' address lines and 'P' read/write control lines during testing. The test circuit in the first form of the invention comprises a finite state machine means, a first multiplexer assembly, an addressing assembly, and a read/write control assembly.

The finite state machine means is adapted to sequence through a series of states for testing the at least one memory circuit. The first multiplexer assembly is adapted to be embedded on the chip and has a series of 'N' first inputs and a series of 'N' second inputs. The choice of which series of inputs is connected to the series of 'N' outputs of the first multiplexer assembly is determined by the state of a testing control line on the finite state machine means. Each of the first multiplexer assembly outputs is adapted to be connected to a respective one of the data input lines of the at least one memory circuit. Those first inputs on the first multiplexer assembly that are adapted to be connectable with the data input lines '2' to 'N' on the at least one memory circuit are adapted to be connected to the data output lines '1' to 'N-1', respectively, on the at least one memory circuit. The first input on the first multiplexer assembly that is adapted to be connectable with data input line '1' on the at least one memory circuit is connected to a data output port on the finite state machine means. Data output line 'N' on the at least one memory circuit is adapted to be connected to a data input port on the finite state machine means. The series of second inputs on the first multiplexer assembly and the data output lines on the at least one memory circuit are adapted to be connected to a data bus on the chip for non-test operation of the at least one memory circuit.

The addressing assembly has a series of 'M' outputs each connected to a respective one of the 'M' address lines of the at least one memory circuit. The addressing assembly has a series of first inputs adapted to be connected to the finite state machine means, and has a series of second inputs adapted to be connected to a bus on the chip. The testing control line is connected to the addressing assembly, and the state of the testing control line determines whether the series of first inputs or the series of second inputs of the addressing assembly determines the state of the 'M' outputs of the addressing assembly. The read/write control assembly has a series of 'P' outputs each connected to a respective one of the 'P' read/write control lines on the at least one random access memory circuit. The read/write control assembly has a series of first inputs adapted to be connected to the finite state machine means and has a series of second inputs adapted to be connected to a read/write control bus on the chip. The testing control line is connected to the read/write control assembly, and the state of the testing control line determines whether the series of first inputs or the series of second inputs of the read/write control assembly determines the state of the 'P' outputs of the read/write control assembly.

For purposes of testing the memory circuit, the finite state machine means actuates the testing control line such that the 'N' first inputs on the first multiplexer assembly are the outputs on that assembly and such that the state of the first inputs on the addressing and read/write control assemblies determine the state of the 'M+P' outputs on those assemblies. During such actuation, the finite state machine means applies each of the possible addresses to the at least one memory circuit, and during the application of each address, repeatedly performs the steps of applying a test bit to the data output port, performing a read operation and performing a write operation. The three steps are repeated at each address a sufficient number of times for the finite state machine means to determine from the test bits received on the data input port whether the at least one memory circuit is defective.

The second form of the invention differs from the first in that each of the embedded memory circuits may differ in length from each other, and additional components are required to handle that difference. Also, instead of sending test bits through all of the memory circuits in series such that the test bits move out of one memory circuit and into another as in the first form of the invention, the finite state machine in the second form of the invention is able to select each of the memory circuits in turn and send the test bits through only the selected memory circuit. This is achieved by means of a multiplexing arrangement in which the finite state machine means actuates a memory circuit selection means, which outputs signals to a finite state machine input selection means, the addressing assembly and the finite state machine means. By means of the finite state machine input selection means the memory circuit selection means controls which memory circuit has its final position data output line connected to the data input port of the finite state machine means. The memory circuit selection means also sends signals relating to the size of the particular memory circuit to the addressing assembly and finite state machine means. While the data input and output ports of the finite state machine means are connected to a particular memory circuit, each of the possible addresses of that memory circuit are applied, and at each of those addresses a series of read and write operations is performed similar to the operations performed at each address in the first form of the invention.

The addressing assembly may comprise a counter means. Alternatively, the addressing assembly may comprise a counter means and a second multiplexer assembly. In the latter form, the series of first inputs on the addressing assembly are inputs on the counter means. The series of outputs on the addressing assembly are the outputs on the second multiplexer assembly. A series of outputs from the counter means is connected to a respective one of a series of first inputs on the second multiplexer assembly. The series of second inputs on the addressing assembly are a series of second inputs on the second multiplexer assembly which are adapted to be connected to an address bus on the chip. The testing control line is connected to the second multiplexer assembly, and the state of that control line determines which of the series of first and second inputs on the second multiplexer assembly are connected to the address lines on the at least one memory circuit.

The read/write control assembly may comprise a timing generator means and a third multiplexer assembly. The series of first inputs on the read/write control assembly are inputs on the timing generator means. The series of 'P' outputs on the read/write control assembly are outputs on the third multiplexer assembly. The timing generator means has 'P' outputs each connected to a respective one of a series of first inputs on the third multiplexer assembly. The series of second inputs on the read/write control means is a series of 'P' second inputs on the third multiplexer assembly. The testing control line is connected to the third multiplexer assembly, and the state of the that control line determines which of the series of first and second inputs on the third multiplexer assembly are connected to the 'P' address lines on the at least one memory circuit.

The second and third multiplexer assemblies may be adapted to be embedded on the same chip on which the at least one memory circuit is adapted to be embedded. Alternatively, the whole of the addressing and read/write control assemblies may be adapted to be embedded on that chip. The finite state machine means may also be embedded on that chip.

The memory test circuit of the invention will now be further described by means of a preferred embodiment utilizing the accompanying drawings, in which:

FIG. 4 is a table which demonstrates the successive serial movement of the digit '1' through the memory cells at a defined address in an embedded RAM circuit.

Figure 1:
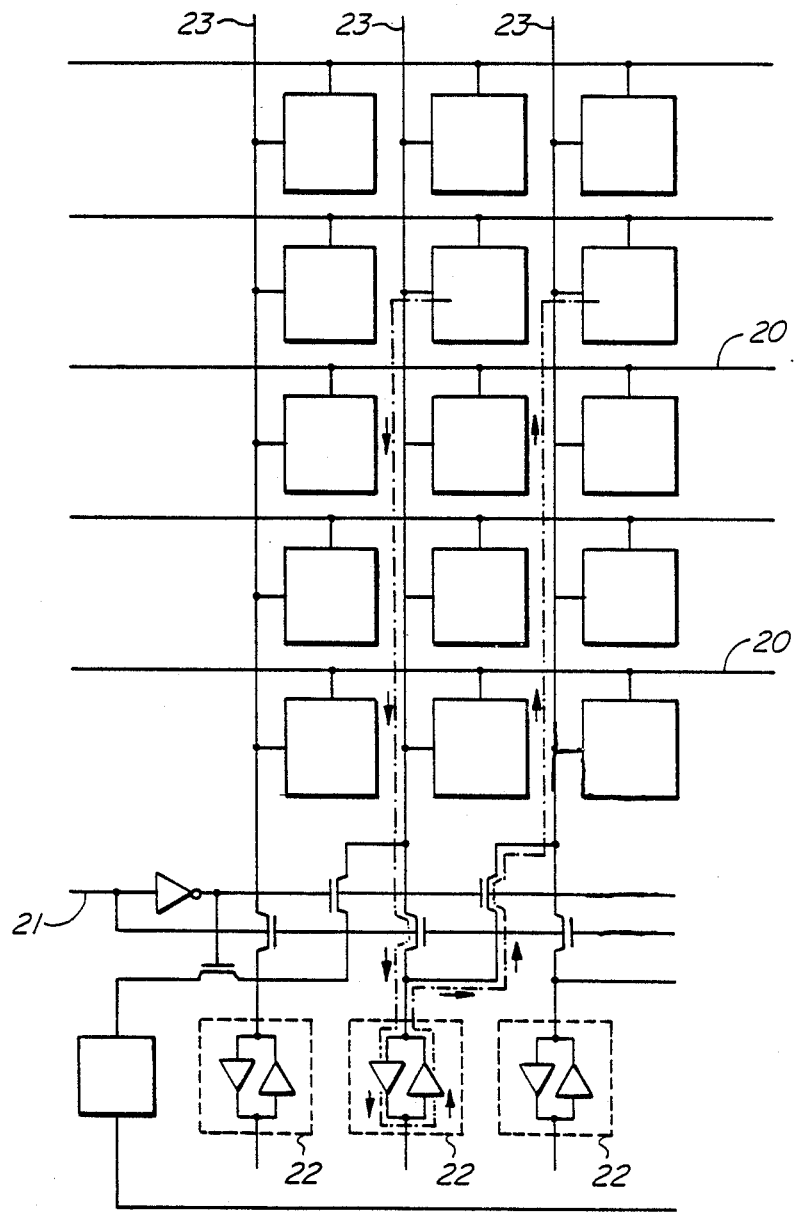
FIG. 1 illustrates a modified dynamic RAM circuit for use with BIST circuitry, as described in the You and Hayes paper.

The dynamic RAM circuit of FIG. 1 is described in the You and Hayes paper. That circuit performs a series of shift operations which moves the contents of an addressed memory row to the right. Each shifting operation is initiated by a refresh timer (not shown). One of the rows of cells is read by activating the row line 20 selected by the row address in a refresh counter (not shown), the shift control line 21 being in the active (high) state. After the sense amplifiers 22 sense the bit lines 23, shift control line 21 changes to the low state which sends the data bits onto the bit lines 23 connected to adjacent cells. The shifted data bits are then written into the adjacent cells by activating the same row line. The path followed during the shifting of one bit is illustrated in FIG. 1.

The test circuit of this invention is intended to be used on chips which will carry embedded RAM circuits having latched outputs, separate input and output data lines, address lines, and read/write control lines (read and write possibly being the two states of a single line). Such arrangement represents a normal configuration for embedded RAM circuits, and established designs do not require modification to take advantage of the test circuit of the invention.

The serial testing technique to be described converts a RAM circuit into a distributed shift register. Each shift register can be envisioned as having a master section and a slave section. The slave section is the output latch which is clocked by the READ strobe; each such output latch is shared among all of the memory cells connected to the particular bit line. Each memory cell constitutes the master section when it is accessed during a READ operation or WRITE operation.

Figure 2:
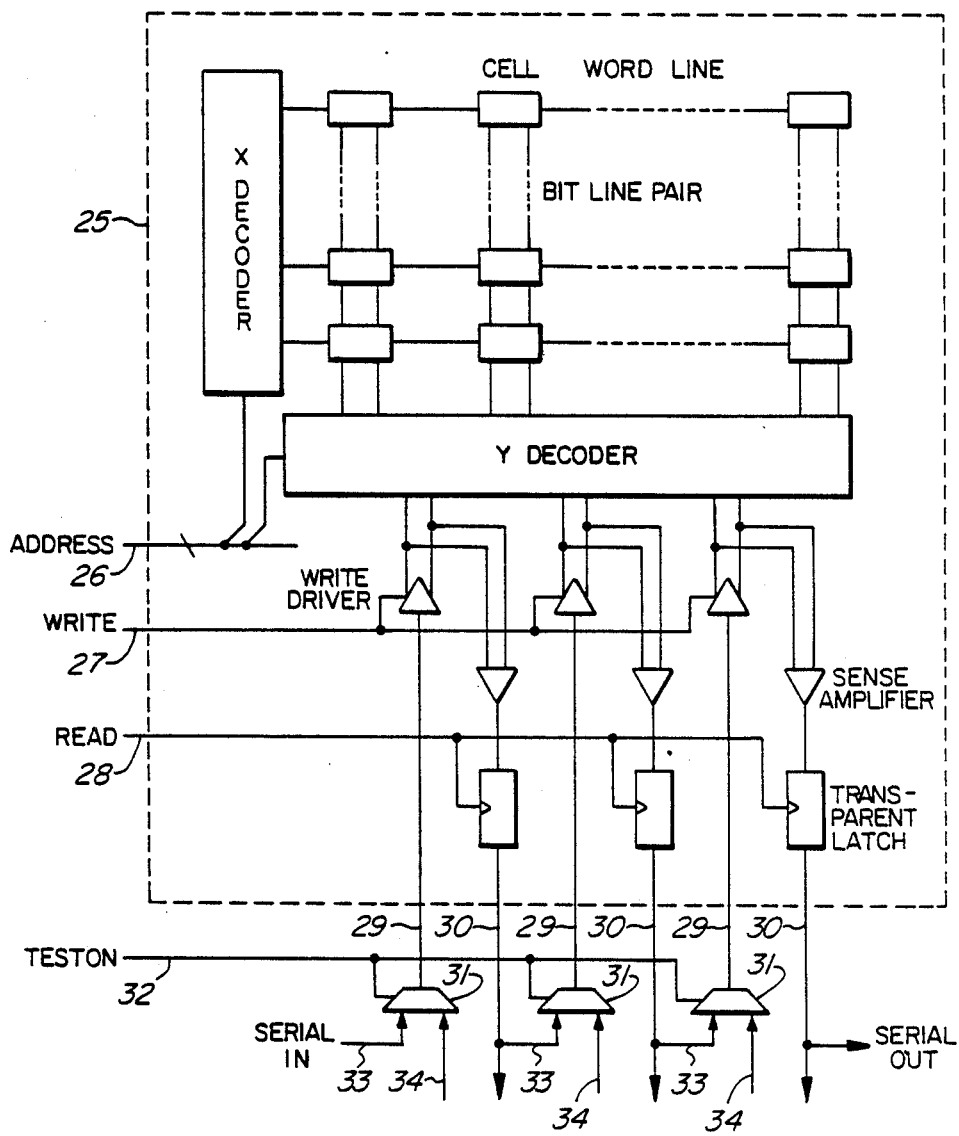
FIG. 2 illustrates an embedded RAM circuit from which extend data, address and read and write control lines, the data lines being connected to multiplexer units of the test circuit of the subject invention.

Shown within the dashed boundary in FIG. 2 is a RAM circuit 25 which is of proven design and has address lines, separated read and write lines, and separated input and output data lines. Connecting with RAM circuit 25 are a series of address lines 26, a write control line 27, a read control line 28, a series of data input lines 29, and a series of data output lines 30. When write control line 27 is actuated, data moves from the data input lines 29 into that group of memory cells on the word line of RAM circuit 25 that is addressed by address lines 26. Similarly, when read control line 28 is actuated, data in the group of memory cells of RAM circuit 25 that is addressed by address lines 26 moves to the data output lines 30. The test circuit of the invention, which is adapted to interface to one or more RAM circuits, includes a series of two-input multiplexers units 31 and a TESTON control line 32 for determining which of two sets of inputs are passed through the multiplexer units 31. A first input 33 of each pair of multiplexer inputs, with the exception of the first input designated 'SERIAL IN' in FIG. 2, is connected to the data output line of the adjacent bit position. The second input 34 of each pair of multiplexer inputs is connected to the data bus on the chip on which memory circuit 25 is embedded.

Figure 3:
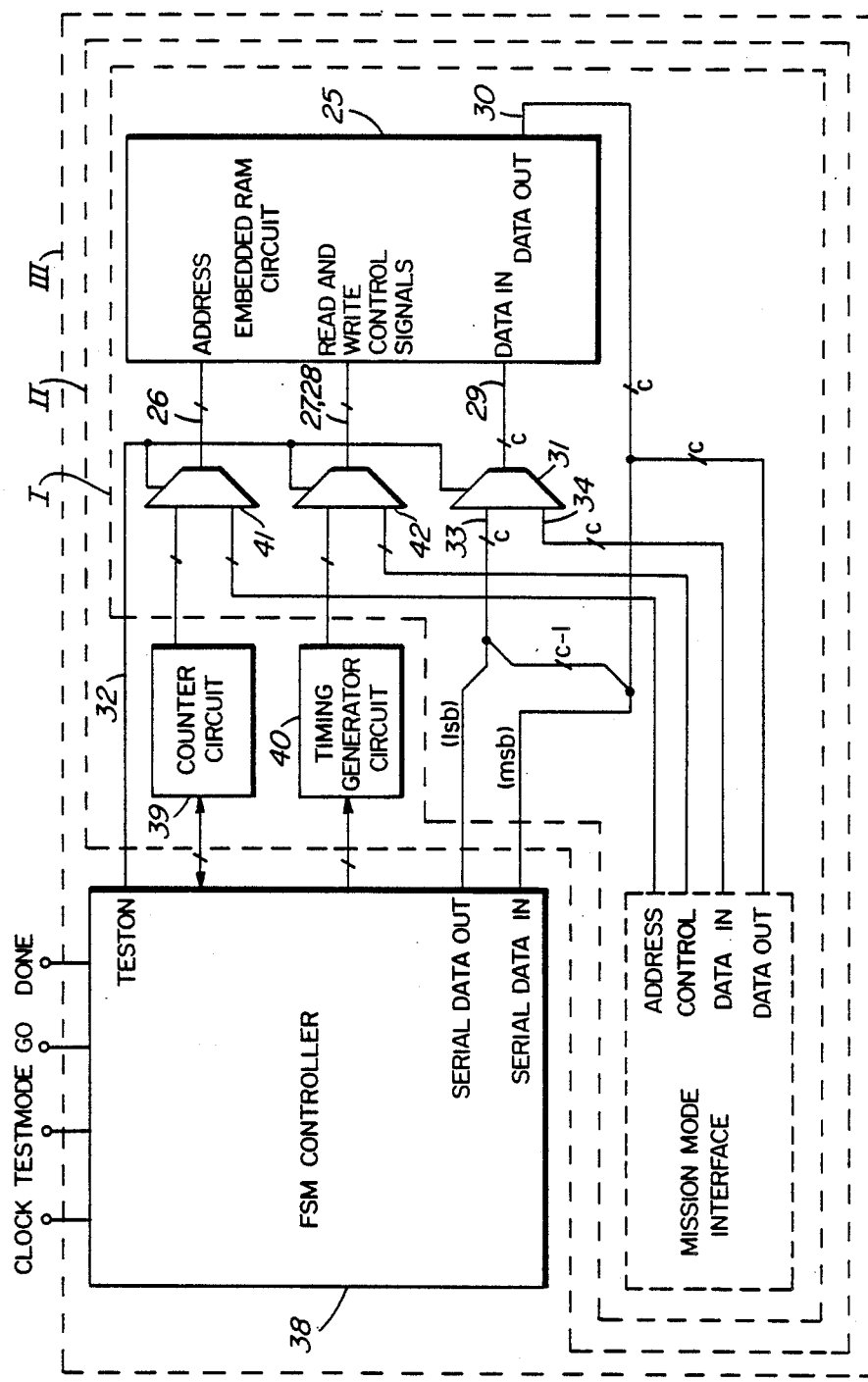
FIG. 3 illustrates a first embodiment of the test circuit of the subject invention, and the connections between that circuit and embedded RAM circuitry.

A first embodiment of a complete test circuit is illustrated in FIG. 3. RAM circuit 25 has 'c' data input lines and 'c' data output lines. The number of data output lines 30 that are connected to the first inputs 33 of multiplexer units 31 is therefore 'c-1'. The other first input 33, i.e. 'SERIAL IN' in FIG. 2, is connected to 'SERIAL DATA OUT' on a FSM (finite state machine) controller 38. The data output line 30 that is connected to 'SERIAL OUT' in FIG. 2 is connected to 'SERIAL DATA IN' on FSM controller 38. FSM controller 38 has a CLOCK input, a test enable input TESTMODE, a test-successful indicator output GO, and a test-completed indicator output DONE; those four control signals interface with the main chip controller (not shown). As shown in FIG. 3, FSM controller 38 is connected to the input of a counter circuit 39 for generating addresses and to the input of a timing generator circuit 40 for generating read and write control lines. The parallel output of counter circuit 39 defines a first set of inputs into a multiplexer assembly 41; the second set of inputs into multiplexer assembly 41 are the address lines of the address bus of the chip. The output of multiplexer assembly 41 are the address lines 26 to RAM circuit 25. The output of timing generator circuit 40 are the read and write control lines used during the testing of RAM circuit 25. Those control lines define a first set of inputs into a multiplexer assembly 42, the read and write control lines used during non-test operation of RAM circuit 25 defining the second set of inputs. The output of multiplexer assembly 42 are the write control line 27 and the read control line 28 of FIG. 2. The TESTON control line 32 that is connected to the series of multiplexer units 31 is also connected to the multiplexer assemblies 41 and 42. MISSION MODE INTERFACE in FIG. 3 refers to the interface on the chip that is presented to RAM circuit 25 during the periods when the test circuitry is not connected.

The main controller on the chip bearing the embedded RAM circuit 25 initiates the testing of that circuit by enabling the TESTMODE input to FSM controller 38. FSM controller 38 then actuates TESTON output line 32 which assumes the state necessary for connecting the first inputs of multiplexer units 31 and multiplexer assemblies 41 and 42 to RAM circuit 25. FSM controller 38 next interfaces with counter circuit 39 to place an initial address on the address lines 26. For some algorithms, FSM controller 38 simply sends a clocked input to counter circuit 39, that circuit incrementing with each clocked input. Some other algorithms also require that a separate decrement input line connect FSM controller 38 and counter circuit 39; a reset connecting line is also required. When the initial address has been latched by counter circuit 39, FSM controller 38 drives timing generator circuit 40 to produce a series of alternating read and write control signals on the read and write control lines of RAM circuit 25. Prior to the generation of each write control signal, FSM controller 38 places a test bit on its SERIAL DATA OUT port. The effect of these steps is that FSM controller 38 inserts a series of test bits serially into RAM circuit 25 at the initial address, the initial test bit thereby moving from one side to the other side of the addressed word in RAM circuit 25. This shifting operation is depicted in FIG. 4, in which '1's are being entered into the left side of a 4-bit-wide word at a selected address; the word contents after each of nine successive operations is shown. With reference to FIG. 2, 'R0' stands for 'Read a 0 on Serial Out', 'W1' stands for 'Write a 1 on Serial In', and 'X' stands for 'Indeterminate'.

FSM controller 38 is aware of the width of the addressed word in RAM circuit 25 and expects the initial test bit to appear on the data output line 30 of the final bit position in RAM circuit 25, and thus at the SERIAL DATA IN port of controller 38, after a certain number of read and write operations. Each of the test bits is examined as it is retrieved to determine if its state has been altered by its passage through RAM circuit 25. With the TESTON line 32 maintained in the testing state, the address on address lines 26 is then altered by counter circuit 39, and the series of read and write operations is repeated. The same process is repeated for each of the addresses in RAM circuit 25. The number of times the process repeats and the address sequence that must be followed are dictated by algorithms unique to each memory. This invention can accommodate a large number of such algorithms.

Figure 5:
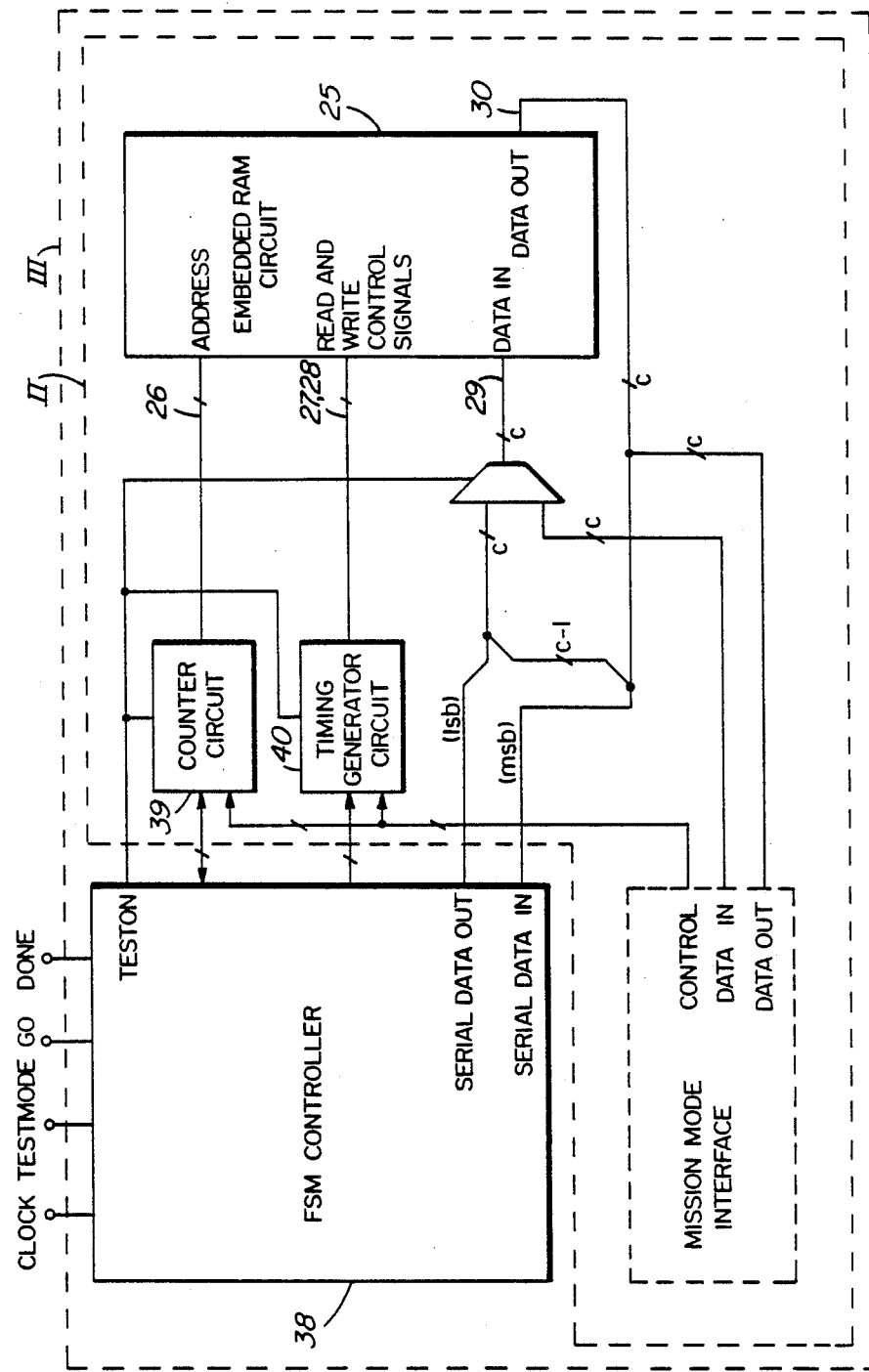
FIG. 5 illustrates a second embodiment of the test circuit of the subject invention, and the connections between that circuit and embedded RAM circuitry.

FIG. 5 illustrates a second embodiment of the test circuit of the invention. This embodiment differs from the first embodiment only in the way in which the address lines and the read/write control lines are interfaced to RAM circuit 25. The TESTON line connects directly to counter circuit 39 and timing generator circuit 40, and the outputs of those circuits are interfaced to RAM circuit 25 directly. The state of the TESTON line determines whether the reset and clocking inputs into counter circuit 39 are from FSM controller 38 or from the control bus of the chip, and also determines whether the inputs to timing generator circuit 40 are from FSM controller 38 or the control bus of the chip.

The dashed enclosures designated I, II, and III in FIGS. 3 and 5 illustrate which portions of the test circuitry of the invention may be embedded on the same chip on which RAM circuit 25 is embedded. With respect to enclosure I of FIG. 3, only the multiplexer units 31 and multiplexer assemblies 41 and 42 are contained on the same chip as RAM circuit 25. The counter circuit 39 and timing generator circuit 40 may also be enclosed on the same chip, as depicted by enclosure II of FIG. 3. The FSM controller 38 may also be on the same chip, in which case the test circuit would properly be classified as a 'BIST circuit'.

With respect to enclosure I in FIG. 3, memory circuit 25 is embedded, and addressing, control and data signals originate on the chip during the mission mode operation of the device. Multiplexer assemblies 41 and 42 provide access to the address and control signals, respectively, of memory circuit 25, whereas the multiplexer units 31 allow an interface with the data path. Only two pins are needed to access the data path, the relevant lines being marked (lsb) and (msb). The value 'c' in FIG. 3 is intended to be greater than 2 and may be as high as 100 for a single memory, or even more if a daisy chain arrangement (to be discussed) of several memories is tested. In this arrangement, it can be assumed that the number of address lines is relatively small because of the potential high cost of routing those lines to the chip boundary. This arrangement has particular utility where the test area must be minimized.

Counter circuit 39 and timing generator circuit 40 have been placed on the chip in the arrangement of enclosure II. The conditions are similar to that described with respect to enclosure I, except that the number of address lines is too large to allow their routing to pins. A further possible reason for including circuits 39 and 40 on the chip is that the address sequence required to implement a particular test algorithm may be too complicated and/or long for automatic test equipment to be able to emulate FSM controller 38 as well as circuits 39 and 40.

With respect to the BIST arrangement shown within enclosure III of FIG. 3, the chip is able to test its own memory without external intervention. The test request is made by asserting the TESTMODE pin, and the CLOCK must be free-running during the execution of the test. The GO output indicates a successful test, and the DONE output indicates the completion of the test. This arrangement requires the use of a minimal number of pins.

The circuitry within enclosure II in FIG. 5 is similar to the circuitry within enclosure II in FIG. 3, except that in the former case counter circuit 39 and timing generator circuit 40 are used for both the testing and non-testing operations. The amount of test circuitry is therefore reduced. With regard to the circuitry within enclosure III in FIGS. 3 and 5, FIG. 5 has less dedicated BIST circuitry because of the sharing of resources between the testing and non-testing modes.

Figure 6:
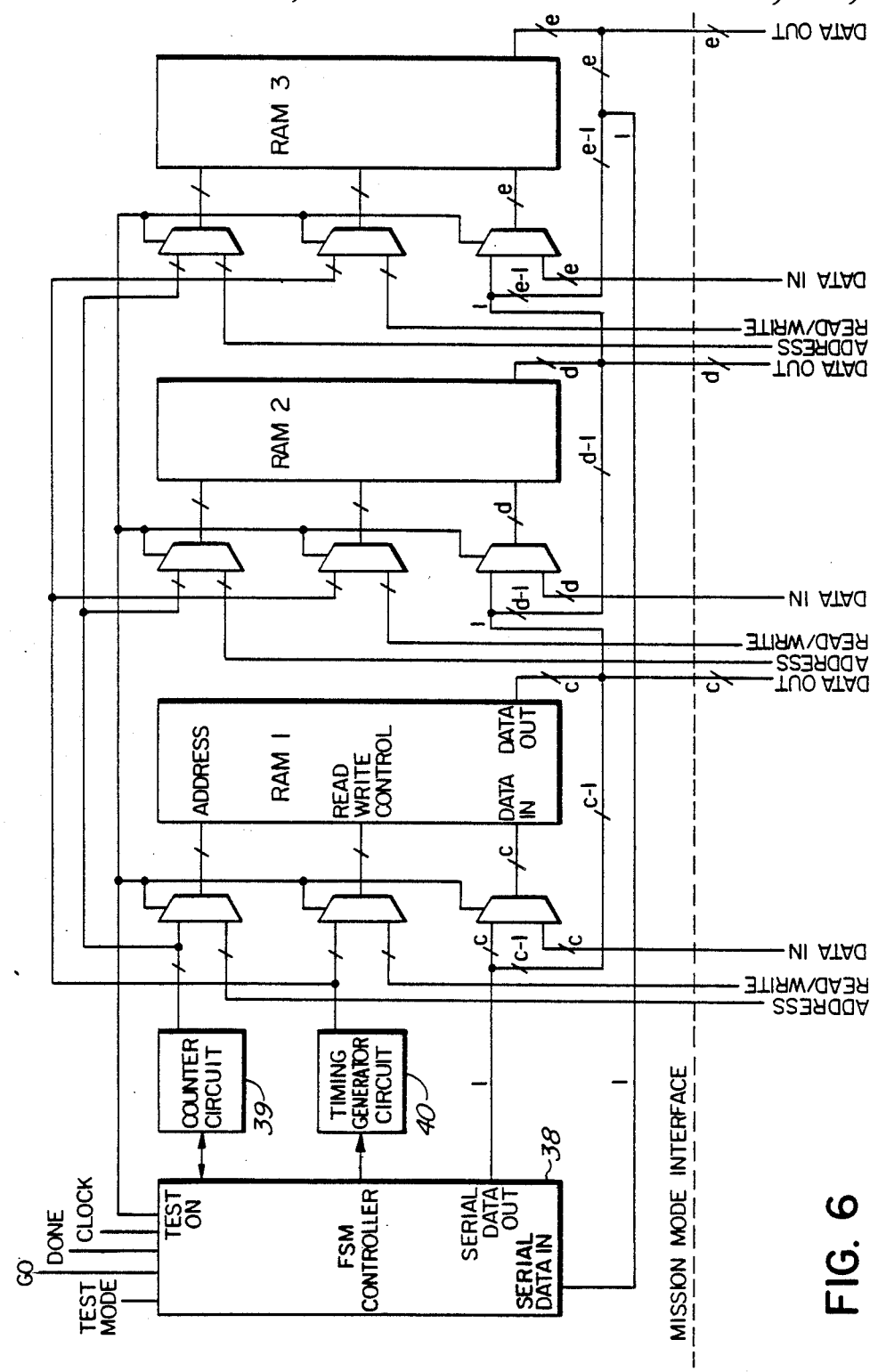
FIG. 6 illustrates a daisy chain arrangement for sharing the test circuit of the first embodiment among three embedded RAM circuits; and, FIG. 7 illustrates a multiplexing arrangement for sharing the test circuit of the first embodiment among three embedded RAM circuits.
Figure 7:
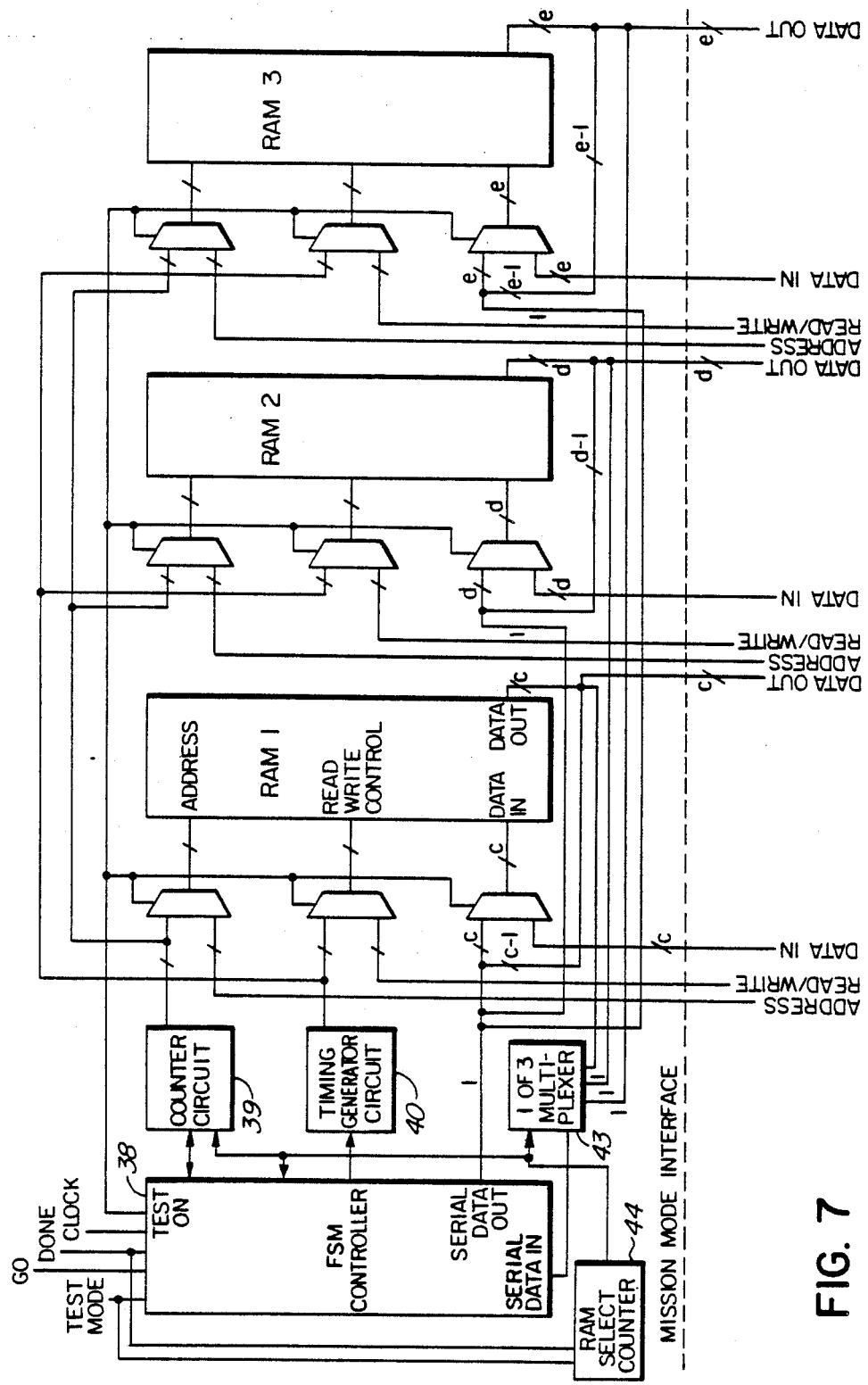

FIGS. 6 and 7 illustrate two different first embodiment test circuits for testing three RAM circuits on one chip, the RAM circuits being designated RAM1, RAM2 and RAM3. In FIG. 6, the RAM circuits are connected in a daisy chain arrangement. With reference to the notation used in FIG. 2, the SERIAL IN data input line of RAM1 in FIG. 6 is connected to the SERIAL DATA OUT port of FSM controller 38, the SERIAL OUT data output line of RAM1 is connected to the SERIAL IN data input line of RAM2, the SERIAL OUT data output line of RAM2 is connected to the SERIAL IN data input line of RAM3, and the SERIAL OUT data output line of RAM3 is connected to the SERIAL DATA IN port of FSM controller 38. The counter circuit 39 and timing generator circuit 40 are connected to RAM1, RAM2 and RAM3 in parallel. When FSM controller 38 actuates the TESTON line, the same word address is placed onto the address lines of each of the three RAM circuits. The three RAM circuits may have different word widths, designated 'c', 'd' and 'e' in FIG. 6; each of those RAM circuits may be located in different sections of the chip, and their three data buses may be completely separate The FSM controller 38 transmits 'c+d+e' test bits from its SERIAL DATA OUT port before retrieving the first test bit on its SERIAL DATA IN port from RAM3. This arrangement for sharing the test circuitry simplifies the testing procedure since the three memories are treated as if they were one large memory. Note also that the test circuitry may not be all embedded on the chip, as earlier described with respect to FIGS. 3 and 5.

The FSM circuit of FIG. 7 differs from that in FIG. 6 in that the SERIAL OUT data output line of each RAM circuit is connected as an input to a 1-of-3 Multiplexer 43. RAM Select Counter 44, which is connected to the TESTMODE input and DONE output of FSM controller 38, co-ordinates which one of the three inputs to multiplexer 43 is connected to the SERIAL DATA IN line of FSM controller 38. RAM Select Counter 44 is also connected to counter circuit 39 for reconfiguring the count in that circuit to the length of the particular RAM circuit being addressed, and is connected to FSM controller 38. Once RAM Select Counter 44 signals FSM controller 38 as to which of the RAM circuits is being accessed, controller 38 is aware of how many read/write cycles will be required at each address of that RAM circuit.

The circuit of FIG. 7 operates in the following way. The initial Testmode input change is sensed by the RAM Select Counter 44 which signals Counter Circuit 39 to adjust its length to that of the initial RAM circuit. RAM Select Counter 44 also signals the 1-of-3 Multiplexer 43 to connect the final data output line of the initial RAM circuit to the SERIAL DATA IN port on the FSM controller 38, and signals FSM controller 38 to adjust the length of its test bit output to match the width of the initial RAM circuit. After all of the addresses of the initial RAM circuit have been tested, FSM controller 38 changes the state of the DONE output, which in turn advances the state of RAM Select Counter 44, which then sends out the appropriate signals for testing the next RAM circuit. One advantage of the configuration of FIG. 7 is a better diagnostic capability and a faster execution time for some testing algorithms.

As mentioned, FSM controller 38 is a finite state machine which embodies the actual test algorithm. As well as using counter circuit 39 for addressing the RAM circuits, FSM controller 38 could make use of that counter circuit to count the number of bit positions in each RAM circuit. In such case, the counters of counter circuit 39 would need to be as long as the greatest memory dimension which must be accommodated. The key issues in determining how easily a test circuit can be shared among RAM circuits are, firstly, the amount of additional circuitry required to interconnect the BIST circuit with the individual RAM circuits, and secondly, the similarity between the memories, for instance, whether they contain the same or different numbers of words. For the architecture of FIG. 6, all of the RAM circuits, i.e. RAM1, RAM2 and RAM3, must have the same length—although they need not have the same width. The architecture of FIG. 7 does not have such a limitation.

A number of algorithms have been developed for use in association with the serial testing technique described. Each of those algorithms is an adaptation of a well-known method. Only the most widely applicable algorithm, called SMARCH, will be described. SMARCH is a March-like algorithm which has six steps. With reference to the circuit of FIG. 3, the first step initializes the RAM circuit 25 with '0's. The TESTON line connects the multiplexer arrangement previously described such that counter circuit 39, timing generator circuit 40 and the serial connections previously discussed are connected to the RAM circuit. A first address is then placed on RAM circuit 25 and a string of '0's is serially written to that address from the SERIAL DATA OUT port of FSM controller 38. Once the SERIAL DATA IN port of FSM controller 38 receives back the transmitted '0's, i.e. after '2c' read operations and '2c' write operations ('c' being the width of the RAM circuit), the address is incremented and the serial transmission of '0's repeated. After all of the addresses of RAM circuit 25 have been accessed in this manner, the second step involves repeating the first step, but with '1's being transmitted. The third step involves repeating the second step, but with '0's being transmitted instead of '1's. The fourth and fifth steps are identical to the second and fourth steps, respectively, except that the memory addresses are accessed in backward rather than forward order. Only the read operation in the sixth step is of interest, and any value can be written to the RAM circuits during that step. The total number of operations using SMARCH is '12cw' read operations and '12cw' write operations, where 'w' is the number of addressed words in the RAM circuit.

The described testing circuitry has already been successfully applied to several product chips.

We claim:

1. A memory test circuit capable of testing one or more random access memory circuits, the one or more random access memory circuits being adapted to be embedded on a chip and having an aggregate of 'N' data input lines and 'N' data output lines, each memory circuit of the one or more memory circuits sharing the same 'M' address lines and 'P' read/write control lines during testing, the memory test circuit comprising:

(a) a finite state machine means adapted to sequence through a series of states for testing the one or more memory circuits;

(b) a first multiplexer assembly adapted to be embedded on the chip and having a series of 'N' first inputs and a series of 'N' second inputs, a testing control line on the finite state machine means determining whether the series of 'N' first inputs or the series of 'N' second inputs is connected to a series of 'N' outputs on the first multiplexer assembly, each output of the series of 'N' outputs on the first multiplexer assembly being adapted to be connected to a respective one of the 'N' data input lines on the one or more memory circuits, those first inputs on the first multiplexer assembly that are connectable to the data input lines '2' to 'N' on the one or more memory circuits being adapted to be connected to the data output lines '1' to 'N-1', respectively, on the one or more memory circuits, that input of the series of 'N' first inputs on the first multiplexer assembly that is connectable with data input line '1' on the one or more memory circuits being adapted to be connected to a data output port on the finite state machine means, data output line 'N' on the one or more memory circuits being adapted to be connected to a data input port on the finite state machine means, the series of second inputs on the first multiplexer assembly and the data output lines on the one or more memory circuits being adapted to be connected to a data bus on the chip for non-test operation of the one or more memory circuits;

(c) an addressing assembly having a series of 'M' outputs each connected to a respective one of the 'M' address lines on the one or more memory circuits, the addressing assembly having a series of first inputs adapted to be connected to the finite state machine means and having a series of second inputs adapted to be connected to a bus on the chip, the testing control line being connected to the addressing assembly, the testing control line determining whether the series of first inputs or the series of second inputs on the addressing assembly determines the state of the 'M' outputs on the addressing assembly; and, (d) a read/write control assembly having a series of 'P' outputs each connected to a respective one of the 'P' read/write control lines on the one or more random access memory circuits, the read/write control assembly having a series of first inputs adapted to be connected to the finite state machine means and having a series of second inputs adapted to be connected to a control bus on the chip, the testing control line being connected to the read/write control assembly, the testing control line determining whether the series of first inputs or the series of second inputs on the read/write control assembly determines the state of the 'P' outputs of the read/write control assembly; whereby, for purposes of testing the one or more memory circuits, the finite state machine means actuates the testing control line such that the 'N' first inputs on the first multiplexer assembly are the outputs on that assembly and such that the first inputs on the addressing and read/write control assemblies determine the 'M+P' outputs on those assemblies, the finite state machine means during such actuation applying each possible address to the one or more memory circuits and during the application of each address repeatedly performing the steps of applying a test bit to the data output port, performing a read operation, and performing a write operation, those steps being repeated at each address a number of times sufficient for the finite state machine means to determine from test bits received on the data input port whether the one or more memory circuits are defective.

2. A memory test circuit capable of testing one or more random access memory circuits, those random access memory circuits being adapted to be embedded on a chip, an 'i'th one of the memory circuits being characterized by having '$N_i$' data input lines, '$N_i$' data output lines, '$M_i$' address lines, and 'P' read/write control lines, the memory test circuit comprising:

(a) a finite state machine means adapted to sequence through a series of states for testing the one or more memory circuits;

(b) a memory circuit selection means actuated by the finite state machine means;

(c) a finite state machine input selection means having a series of inputs each adapted to connect to a final data output line of a respective one of the memory circuits, and having an output adapted to connect to the input port on the finite state machine, the memory circuit selection means determining which of the inputs of the finite state machine input selection means is connected to the output;

(d) a first multiplexer assembly adapted to be embedded on the chip for each memory circuit, the first multiplexer assembly for the 'i'th memory circuit having a series of '$N_i$' first inputs and a series of '$N_i$' second inputs, a testing control line on the finite state machine means determining whether the series of '$N_i$' first inputs or the series of '$N_i$' second inputs is connected to a series of '$N_i$' outputs on the first multiplexer assembly, each of the first multiplexer assembly outputs on the 'i'th memory circuit being adapted to be connected to a respective one of the data input lines on the 'i'th memory circuit, those first inputs on the first multiplexer assembly that are connectable to the data input lines '2' to '$N_i$' on the 'i'th memory circuit being adapted to be connected to the data output lines '1' to '$N_i$-1', respectively, on the 'i'th memory circuit, the first input on the first multiplexer assembly that is connectable with data input line '1' on each of the memory circuits being adapted to be connected to a data output port on the finite state machine means, the final data output line on each of the memory circuits being adapted to be connected to a respective input of the finite state machine input selection means, the series of second inputs on each first multiplexer assembly of the 'i'th memory circuit and the data output lines on the 'i'th memory circuit being adapted to be connected to a data bus associated with the 'i'th memory circuit on the chip for non-test operation of the 'i'th memory circuit;

(e) an addressing assembly having a series of outputs, the number of outputs being at least equal to the number of address lines on that memory circuit of the at least one memory circuit that has the greatest number of address lines, '$M_i$' outputs of the addressing assembly being connected to a respective one of the '$M_i$' address lines on the 'i'th memory circuit, the memory circuit selection means being connected to the addressing assembly for indicating to the addressing assembly the number of addresses present in each of the memory circuits, the addressing assembly having a series of first inputs adapted to be connected to the finite state machine means and having a series of second inputs adapted to be connected to a bus on the chip, the testing control line being connected to the addressing assembly, the testing control line determining whether the series of first inputs or the series of second inputs on the addressing assembly determines the state of the outputs on the addressing assembly;

(f) a read/write control assembly having a series of 'P' outputs each connected to a respective one of the 'P' read/write control lines on the one or more memory circuit, the read/write control assembly having a series of first inputs adapted to be connected to the finite state machine means and having a series of second inputs adapted to be connected to a control bus on the chip, the testing control line being connected to the read/write control assembly, the the testing control line determining whether the series of first inputs or the series of second inputs on the read/write control assembly determines the state of the 'P' outputs of the read/write control assembly;

whereby, for purposes of testing the one or more memory circuits, the finite state machine means actuates the testing control line such that the first inputs on the first multiplexer assembly of each memory circuit are the outputs on that assembly and such that the first inputs on the addressing and read/write control assemblies determine the state of the outputs on those assemblies, the finite state machine means during each such actuation of the testing control line performing primary steps for each memory circuit of, firstly, actuating the memory circuit selection means to connect the final data output line of the particular memory circuit to the data input port of the finite state machine means and to send information on the particular memory circuit to the addressing assembly and finite state machine means, secondly, applying each possible address to the particular memory circuit, and thirdly, for each of the applied addresses repeatedly performing secondary steps of applying a test bit to the data output port, performing a read operation, and performing a write operation, the primary and secondary steps being repeated a number of times sufficient for the finite state machine means to determine from test bits received on the data input port whether the one or more memory circuits are defective.

3. A memory test circuit as in claim 1 or 2, wherein the addressing assembly comprises a counter means.

4. A memory test circuit as in claim 1 or 2, wherein the addressing assembly comprises a counter means and a second multiplexer assembly, the series of first inputs on the addressing assembly being inputs to the counter means, the series of outputs on the addressing assembly being the outputs of the second multiplexer assembly, a series of outputs from the counter means being connected to a respective one of a series of first inputs on the second multiplexer assembly, the series of second inputs on the addressing assembly being a series of second inputs on the second multiplexer assembly which are adapted to be connected to an address bus on the chip, the testing control line being connected to the second multiplexer assembly, the testing control line determining which of the series of first and second inputs on the second multiplexer assembly are connected to the address lines on the at least one memory circuit.

5. A memory test circuit as in claim 4, wherein the read/write control assembly comprises a timing generator means and a third multiplexer assembly, the series of first inputs on the read/write control assembly being inputs to the timing generator means, the series of outputs on the read/write control assembly being the outputs of the third multiplexer assembly, a series of outputs from the timing generator means being connected to a respective one of a series of first inputs on the third multiplexer assembly, the series of second inputs on the read/write control assembly being a series of second inputs on the third multiplexer assembly which are adapted to be connected to a control bus on the chip, the testing control line being connected to the third multiplexer assembly, the testing control line determining which series of inputs of the series of first and second inputs on the third multiplexer assembly are connected to the read/write control lines on the at least one memory circuit.

6. A memory test circuit as in claim 5, wherein the second and third multiplexer assemblies are adapted to be embedded on the same chip on which the one or more random access memory circuits are adapted to be embedded.

7. A memory test circuit as in claim 1, wherein the addressing assembly and the read/write control assembly are adapted to be embedded on the same chip on which the one or more random access memory circuits are adapted to be embedded.

8. A memory test circuit as in claim 1 or 2, wherein the addressing assembly comprises a counter means adapted to be embedded on the same chip on which the one or more random access memory circuits are adapted to be embedded.

9. A memory test circuit capable of testing one or more random access memory circuits, those random access memory circuits being adapted to be embedded on a chip and having address lines, read/write control lines, and separated data input and data output lines, the memory test circuit comprising:
  (a) a finite state machine means adapted to sequence through a series of states for testing the one or more memory circuits;
  (b) a counter means, the counter means being connected to the finite state machine means and having a series of output lines equal in number to the number of address lines on the one or more random access memory circuits;
  (c) a timing generator means, the timing generator means being connected to the finite state machine means and having a series of output lines equal in number to the number of read/write control lines on the one or more random access memory circuits;
  (d) a series of two-input first multiplexer units adapted to be embedded on the chip, the number of first multiplexer units being equal to the total number of data input lines on the one or more memory circuits, those input lines each being associated with a respective one of a series of consecutive bit positions together representing a row addressed in the one or more memory circuits, the output line of each first multiplexer unit being adapted to be connected to a respective one of the data input lines on the one or more memory circuits, a first input line on each first multiplexer unit with the exception of a first multiplexer unit which is associated with a first position being adapted to be connected to the data output line of the consecutive bit position on the one or more memory circuits, the first input line on the first multiplexer unit associated with the first bit position being adapted to be connected to a data output port on the finite state machine means, the data output line at a final bit position of the one or more memory circuits being adapted to be connected to a data input port on the finite state machine means, the second input line on each first multiplexer unit being adapted to be connected to a respective line of a data bus on the chip for sending parallel data to the one or more memory circuits during non-test operation, the data output lines being adapted to be connected to a respective line of the data bus for receiving parallel data from the one or more memory circuits during non-test operation, the finite state machine means being adapted to be connected to a testing control line on the series of first multiplexer units for selecting whether the data input lines on the one or more memory circuits are connected to either all of the first input lines or all of the second input lines on the first multiplexer units;
  (e) a series of two-input second multiplexer units adapted to be embedded on the chip, the number of second multiplexer units being equal to the total number of address lines on the one or more memory circuits, the output line of each second multiplexer unit being adapted to be connected to a respective one of those address lines, a first input line of each second multiplexer unit being adapted to be connected to the counter means, a second input line of each second multiplexer unit being adapted to be connected to a respective one of the address lines on the chip for providing address signals to the one or more memory circuits during non-test operation, the testing control line being adapted to be connected to the series of second multiplexer units for selecting whether the address lines of the one or more memory circuits are connected to either all of the first input lines or all of the second input lines on the second multiplexer units; and,
  (f) a series of two-input third multiplexer units adapted to be embedded on the chip, the number of third multiplexer units being equal to the total number of read/write control lines on the one or more memory circuits, the output line of each third multiplexer unit being adapted to be connected to a respective one of those read/write control lines, a first input line of each third multiplexer unit being adapted to be connected to the timing generator means, a second input line of each third multiplexer unit being adapted to be connected to a respective one of the read/write control lines on the chip for providing read/write control signals to the one or more memory circuits during non-test operation, the testing control line being adapted to be connected to the series of third multiplexer units for selecting whether the read/write control lines of the one or more memory circuits are connected to either all of the first input lines or all of the second input lines on the third multiplexer units;
  whereby, for purposes of testing the one or more memory circuits, the finite state machine means actuates the testing control line such that the first input lines of the first, second and third multiplexer units are interfaced to the one or more memory circuits, the finite state machine means during such actuation applying each possible address to the one or more memory circuits and during the application of each address repeatedly performing the steps of applying a test bit to the first input of the first multiplexer unit at the first bit position of the one or more memory circuits, performing a read operation, and performing a write operation, those steps being repeated at each address a number of times sufficient for the finite state machine means to determine from test bits received on the data input port whether the one or more memory circuits are defective.

* * * * *